(12) United States Patent
Lee et al.

(10) Patent No.: US 12,677,579 B2
(45) Date of Patent: Jul. 7, 2026

(54) DISPLAY APPARATUS INCLUDING POLARIZATION FILM

(71) Applicant: SAMSUNG DISPLAY CO., LTD.,
Yongin-si (KR)

(72) Inventors: Dukjin Lee, Yongin-si (KR); Beonghun Beon, Yongin-si (KR)

(73) Assignee: SAMSUNG DISPLAY CO., LTD.,
Yongin-si (KR)

( * ) Notice: Subject to any disclaimer, the term of this patent is extended or adjusted under 35 U.S.C. 154(b) by 520 days.

(21) Appl. No.: 18/318,287

(22) Filed: May 16, 2023

(65) Prior Publication Data

US 2023/0371351 A1 Nov. 16, 2023

(30) Foreign Application Priority Data

May 16, 2022 (KR) ........................ 10-2022-0059830
Sep. 1, 2022 (KR) ........................ 10-2022-0111012

(51) Int. Cl.
H10K 59/80 (2023.01)
G02B 5/30 (2006.01)

(52) U.S. Cl.
CPC ....... H10K 59/8793 (2023.02); G02B 5/3083 (2013.01); H10K 59/873 (2023.02)

(58) Field of Classification Search
CPC .. H10K 59/8793; H10K 59/873; H10K 59/12; H10K 59/8731; H10K 59/8791; G02B 5/3083; G02F 1/13363
See application file for complete search history.

(56) References Cited

U.S. PATENT DOCUMENTS

| | | | |
|---|---|---|---|
| 9,140,838 B2 | 9/2015 | Lee et al. | |
| 10,509,149 B2 | 12/2019 | Ohyama et al. | |
| 11,561,635 B1* | 1/2023 | Liu | G06F 3/0412 |
| 2010/0157207 A1* | 6/2010 | Lee | G02F 1/134363 |
| | | | 349/96 |
| 2013/0140587 A1* | 6/2013 | Lim | G02B 5/305 |
| | | | 427/163.1 |
| 2016/0322444 A1* | 11/2016 | Kang | H10K 59/38 |
| 2017/0222188 A1* | 8/2017 | Lee | G02B 5/3016 |
| 2018/0031748 A1 | 2/2018 | Cho et al. | |

(Continued)

FOREIGN PATENT DOCUMENTS

| | | | | |
|---|---|---|---|---|
| CN | 107275505 A | | 10/2017 | |
| CN | 108922903 A | * | 11/2018 | ......... H10K 59/8791 |
| KR | 20060036297 A | * | 4/2006 | ......... G02F 1/13363 |

(Continued)

OTHER PUBLICATIONS

Weijun Zhou et al: "59.1: Development of near Zero Optical Retardation Film from Cyclic Block Copolymers", SID Symposium Digest of Technical Papers, vol. 40, No. 1, Jan. 1, 2009, p. 881.

*Primary Examiner* — Ida M Soward
(74) *Attorney, Agent, or Firm* — F. CHAU & ASSOCIATES, LLC

(57) ABSTRACT

A display apparatus includes a display panel that includes a display element and a thin-film encapsulation layer disposed on the display element, and a polarization film disposed on the display panel and that includes a phase compensation layer, a phase retardation layer, and a polarization layer. A thickness direction phase difference of the display panel is less than or equal to about −35 nm.

22 Claims, 11 Drawing Sheets

(56)             References Cited

U.S. PATENT DOCUMENTS

| 2020/0124921 A1* | 4/2020 | Hai | ................... G02F 1/133634 |
| 2021/0043874 A1 | 2/2021 | Kim et al. | |

FOREIGN PATENT DOCUMENTS

| KR | 10-2010-0000793 | | 1/2010 | | |
| KR | 10-2011-0031537 | | 3/2011 | | |
| KR | 10-1659121 | | 9/2016 | | |
| KR | 20170114514 A | * | 10/2017 | ........... | G02B 5/3083 |
| KR | 10-2116368 | | 5/2020 | | |

* cited by examiner

CIE a∗b∗ (AACD∗)

DISPLAY APPARATUS INCLUDING POLARIZATION FILM

CROSS-REFERENCE TO RELATED APPLICATIONS

This application claims priority under 35 U.S.C. § 119 from Korean Patent Application Nos. 10-2022-0059830 and 10-2022-0111012, respectively filed on May 16, 2022 and Sep. 1, 2022 in the Korean Intellectual Property Office, the contents of both of which are herein incorporated by reference in their entireties.

TECHNICAL FIELD

One or more embodiments are directed to a polarization film and a display apparatus that includes the same.

DISCUSSION OF THE RELATED ART

A display apparatus is a device that displays an image. Examples of a display apparatus include a liquid crystal display (LCD), an organic light-emitting display (OLED), and electrophoretic display (EPD). These display apparatuses include a polarization film that prevents external light from being reflected from a front surface of the display apparatus.

SUMMARY

One or more embodiments include a display apparatus in which a thickness direction phase difference of the display apparatus is within a preset range to increase the visibility of the display apparatus.

According to one or more embodiments, a display apparatus includes a display panel that includes a display element and a thin-film encapsulation layer disposed on the display element, and a polarization film disposed on the display panel and that includes a phase compensation layer, a phase retardation layer, and a polarization layer. A thickness direction phase difference of the display panel is less than or equal to about −35 nm.

The phase compensation layer may include a first phase compensation layer and a second phase compensation layer.

The phase retardation layer may be located between the first phase compensation layer and the second phase compensation layer.

The second phase compensation layer may be located between the phase retardation layer and the polarization layer.

The first phase compensation layer may include a positive C plate.

A thickness direction phase difference of the first phase compensation layer may be less than or equal to about −40 nm.

The second phase compensation layer may include a tri-acetyl cellulose (TAC) film.

A thickness direction phase difference of the second phase compensation layer may be greater than or equal to about +4 nm.

The second phase compensation layer may include a negative C plate.

The second phase compensation layer may be located on the first phase compensation layer, and the phase retardation layer may be located on the second phase compensation layer.

The phase retardation layer may include a quarter-wave plate (QWP).

The polarization film further may include a protective substrate located on the polarization layer.

The display element may include a pixel electrode, a counter electrode, and an emission layer located between the pixel electrode and the counter electrode.

The thin-film encapsulation layer may include at least one inorganic encapsulation layer and at least one organic encapsulation layer.

The at least one inorganic encapsulation layer may include a first inorganic encapsulation layer that includes at least one inorganic material and a second inorganic encapsulation layer that includes at least one inorganic material.

According to one or more embodiments, a polarization film includes a first phase compensation layer that includes a positive C plate, a phase retardation layer disposed on the first phase compensation layer, a second phase compensation layer disposed on a side of the phase retardation layer and that has a thickness direction phase difference of greater than or equal to about +4 nm, and a polarization layer disposed on the second phase compensation layer.

A thickness direction phase difference of the first phase compensation layer may be less than or equal to about −40 nm.

The second phase compensation layer may include a tri-acetyl cellulose (TAC) film or a negative C plate.

The phase retardation layer may include a quarter-wave plate (QWP).

The polarization film may further include a protective substrate disposed on the polarization layer.

According to one or more embodiments, a display apparatus includes a display panel that includes a display element and a thin-film encapsulation layer disposed on the display element, and a polarization film disposed on the display panel and that includes a first phase compensation layer, a second phase compensation layer, a phase retardation layer, and a polarization layer. A thickness direction phase difference of the first phase compensation layer is less than or equal to about −40 nm, and a thickness direction phase difference of the second phase compensation layer is greater than or equal to about +4 nm.

A thickness direction phase difference of the display panel may be less than or equal to about −35 nm.

DETAILED DESCRIPTION

Figure 1:
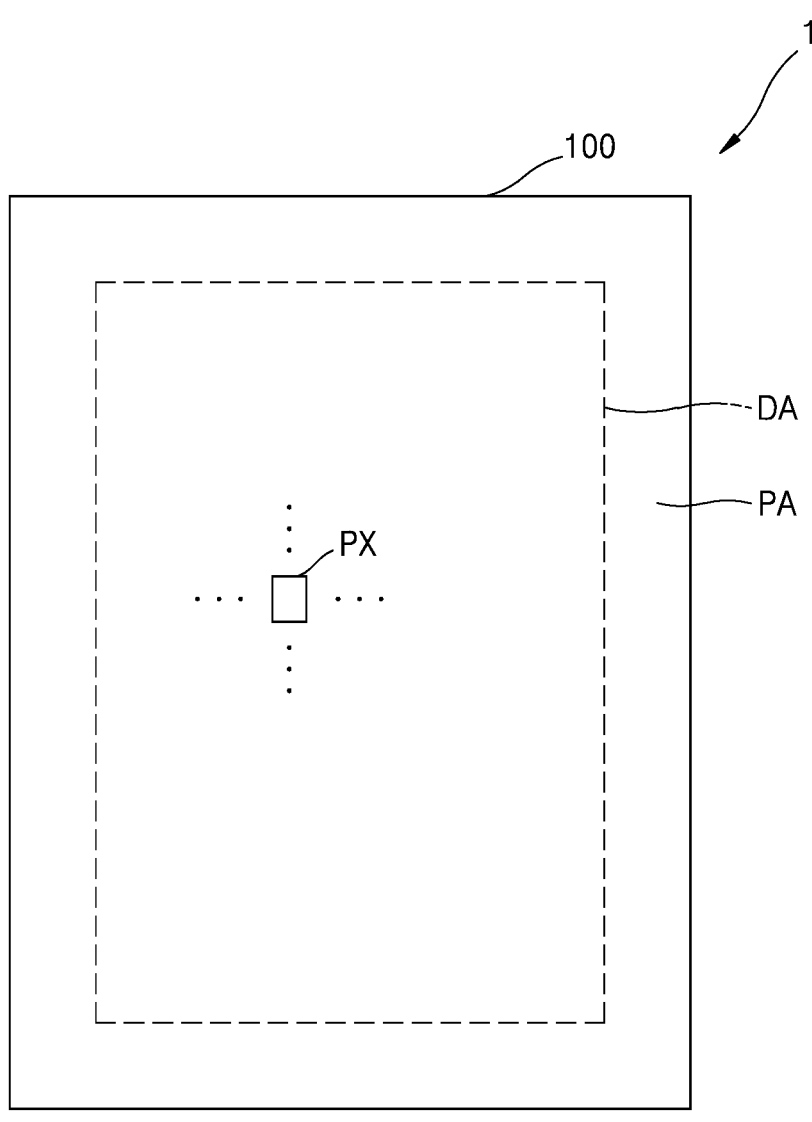
FIG. 1 is a plan view of a display apparatus, according to an embodiment.
Figure 1:
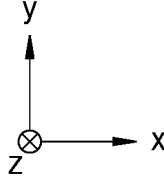

Reference will now be made in detail to embodiments, examples of which are illustrated in the accompanying drawings, wherein like reference numerals may refer to like elements throughout.

It will be further understood that, when a layer, region, or component is referred to as being "on" another layer, region, or component, it may be directly on the other layer, region, or component, or may be indirectly on the other layer, region, or component with intervening layers, regions, or components therebetween.

The term "about" as used herein is inclusive of the stated value and means within an acceptable range of deviation for the particular value as determined by one of ordinary skill in the art, considering the measurement in question and the error associated with measurement of the particular quantity, such as the limitations of the measurement system. For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

In embodiments, "a plan view of an object" refers to "a view of an object seen from above, and "a cross-sectional view of an object" refers to "a view of an object vertically cut and seen from the side. In embodiments, when elements "overlap," it may mean that the elements overlap in a "plan view" and/or a "cross-sectional view".

Hereinafter, embodiments will be described in detail with reference to the accompanying drawings, wherein the same or corresponding elements may be denoted by the same reference numerals throughout.

FIG. 1 is a plan view of a display apparatus, according to an embodiment.

Referring to FIG. 1, in an embodiment, a display apparatus 1 includes a display area DA and a peripheral area PA. The display apparatus 1 includes a substrate 100. For example, the substrate 100 includes the display area DA and the peripheral area PA.

A plurality of pixels PX that each include a display element such as an organic light-emitting diode are arranged in the display area DA of the substrate 100. Each pixel PX further includes a plurality of thin-film transistors and a storage capacitor that control the display element. The number of thin-film transistors in one pixel PX may vary. For example, one pixel may include one to seven thin-film transistors.

Various wirings that transmit electrical signals to the display area DA are located in the peripheral area PA of the substrate 100. A thin-film transistor may also be provided in the peripheral area PA, and the thin-film transistor in the peripheral area PA is a part of a circuit unit that controls electrical signals transmitted into the display area DA.

Although the display apparatus 1 according to an embodiment is described as being an organic light-emitting display apparatus, the display apparatus 1 of embodiments of the present disclosure is not limited thereto. For example, the display apparatus 1 according to an embodiment may be any of various types of display apparatuses, such as an inorganic electroluminescent (EL) display (inorganic light-emitting display) or a quantum dot light-emitting display.

Figure 2:
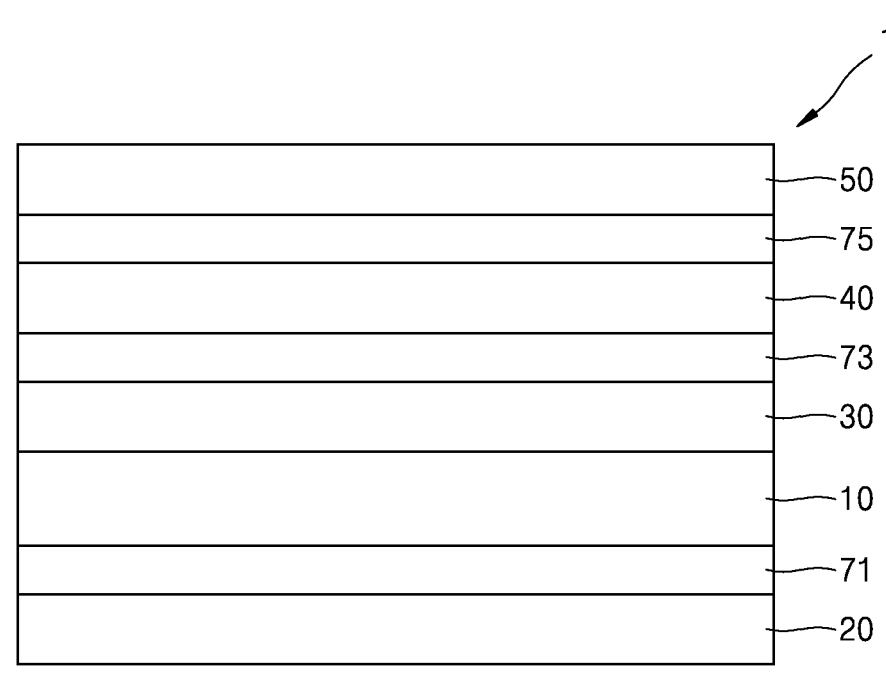
FIG. 2 is a cross-sectional view of a display apparatus, according to an embodiment.

FIG. 2 is a cross-sectional view of a display apparatus, according to an embodiment.

Referring to FIG. 2, the display apparatus 1 according to an embodiment includes a display panel 10, a cushion film 20, an input sensing layer 30, a polarization film 40, and a cover window 50.

The cushion film 20 is located under the display panel 10. The cushion film 20 protects the display panel 10 from external impacts. A first adhesive layer 71 is located between the display panel 10 and the cushion film 20. The first adhesive layer 71 may be a pressure sensitive adhesive (PSA).

The input sensing layer 30 is disposed on the display panel 10. The input sensing layer 30 obtains coordinate information of an external input, such as a touch event. The input sensing layer 30 includes a sensing electrode (or a touch electrode) and trace lines (or signal wirings) connected to the sensing electrode. The input sensing layer 30 is located directly on the display panel 10.

However, embodiments of the disclosure are not necessarily limited thereto.

The polarization film 40 is disposed on the input sensing layer 30. The polarization film 40 will be described in more detail with reference to FIGS. 4 and 5.

A second adhesive layer 73 is disposed between the polarization film 40 and the input sensing layer 30. The second adhesive layer 73 may be a PSA.

The cover window 50 is disposed on the polarization film 40. The cover window 50 protects the display panel 10, the input sensing layer 30, and the polarization layer 40 disposed under the cover window 50. A third adhesive layer 75 is disposed between the polarization film 40 and the cover window 50. The third adhesive layer 75 may be an optically clear adhesive (OCA).

Figure 3:
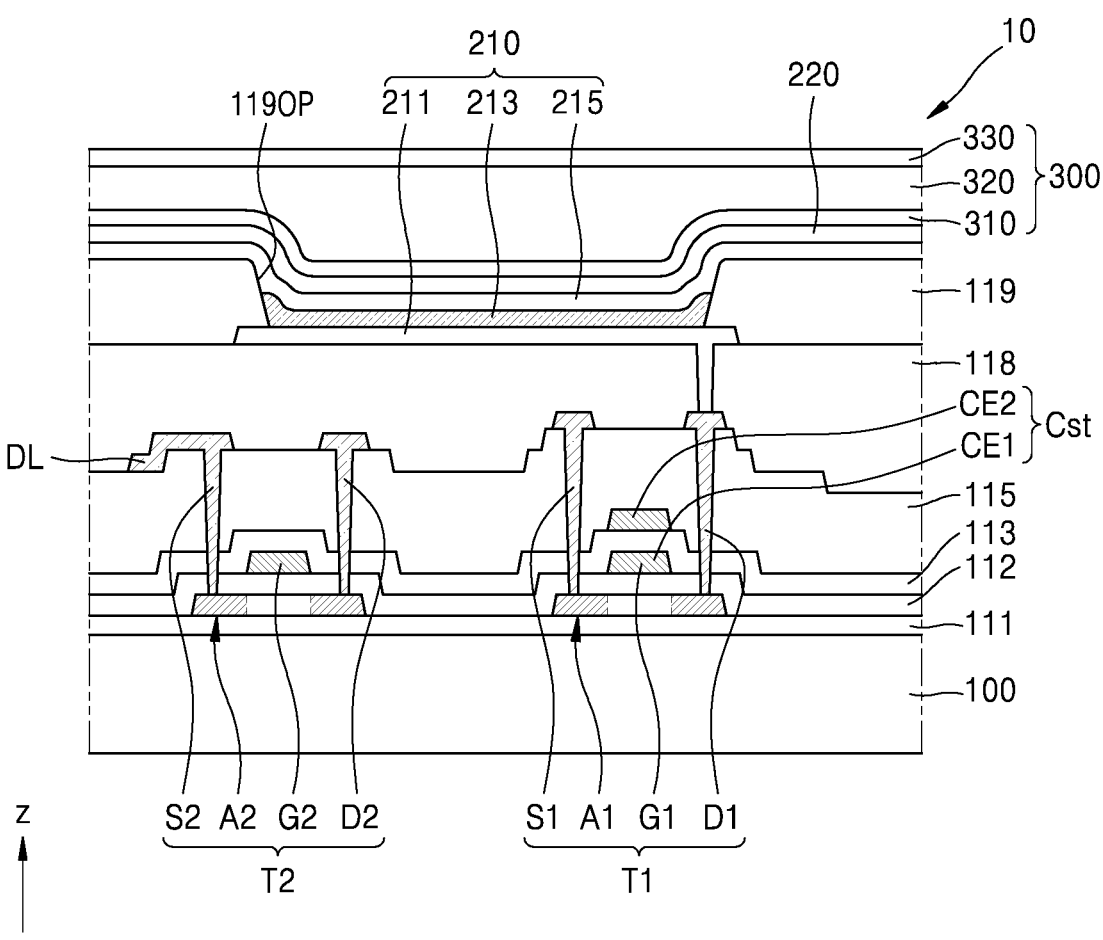
FIG. 3 is a cross-sectional view of apart of a display panel of a display apparatus, according to an embodiment.

FIG. 3 is a cross-sectional view of apart of a display panel of a display apparatus, according to an embodiment.

Referring to FIG. 3, in an embodiment, the display panel 10 includes the substrate 100, first and second thin-film transistors T1 and T2 disposed on the substrate 100, a display element 210 electrically connected to the first and second thin-film transistors T1 and T2, a capping layer 220, and a thin-film encapsulation layer 300. The display panel 10 further includes various insulating layers 111, 112, 113, 115, 118, and 119 and a storage capacitor Cst.

The substrate 100 is formed of any one of various materials, such as a glass, a metal, or a plastic. In an embodiment, the substrate 100 is a flexible substrate. The substrate 100 includes a polymer resin, such as at least one of polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

A buffer layer 111 is disposed on the substrate 100, and reduces or prevents penetration of foreign materials, moisture, or external air from the bottom of the substrate 100 and planarizes the substrate 100. The buffer layer 111 may include an inorganic material such as oxide or nitride, an organic material, or a combination of an organic material and an inorganic material, and may have a single or multilayer structure that includes an inorganic material and an organic material. A barrier layer is further provided between the substrate 100 and the buffer layer 111 to prevent penetration of external air. The buffer layer 111 includes at least one of silicon oxide ($SiO_2$) or silicon nitride ($SiN_x$).

The first thin-film transistor T1 and/or the second thin-film transistor T2 are disposed on the buffer layer 111. The first thin-film transistor T1 includes a first semiconductor layer A1, a first gate electrode G1, a first source electrode S1, and a first drain electrode D1. The second thin-film transistor T2 includes a second semiconductor layer A2, a second gate electrode G2, a second source electrode S2, and a second drain electrode D2. The first thin-film transistor T1 is connected to the display element 210 and functions as a driving thin-film transistor that drives the display element 210. The second thin-film transistor T2 is connected to a data line DL and may function as a switching thin-film transistor. Although two thin-film transistors are illustrated in FIG. 3, embodiments of the disclosure are not necessarily limited thereto. The number of thin-film transistors may changed in various ways in other embodiments. For example, one to seven thin-film transistors may be provided.

In an embodiment, each of the first semiconductor layer A1 and the second semiconductor layer A2 includes one of amorphous silicon or polycrystalline silicon. In an embodiment, each of the first semiconductor layer A1 and the second semiconductor layer A2 includes an oxide of at least one of indium (In), gallium (Ga), tin (Sn), zirconium (Zr), vanadium (V), hafnium (Hf), cadmium (Cd), germanium (Ge), chromium (Cr), titanium (Ti), or zinc (Zn). Each of the first semiconductor layer A1 and the second semiconductor layer A2 includes a channel region, and a source region and a drain region doped with impurities.

The first gate electrode G1 and the second gate electrode G2 are respectively located on the first semiconductor layer A1 and the second semiconductor layer A2 with a first gate insulating layer 112 therebetween. Each of the gate electrode G1 and the second gate electrode G2 includes at least one of molybdenum (Mo), aluminum (Al), copper (Cu), or titanium (Ti), and may have a single or multi-layer structure. For example, each of the first gate electrode G1 and the second gate electrode G2 has a single-layer structure that includes Mo.

The first gate insulating layer 112 includes at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A second gate insulating layer 113 is disposed on the first gate insulating layer 112 and covers the first gate electrode G1 and the second gate electrode G2. The second gate insulating layer 113 includes at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A first storage electrode CE1 of the storage capacitor Cst overlaps the first thin-film transistor T1. For example, the first gate electrode G1 of the first thin-film transistor T1 functions as the first storage electrode CE1 of the storage capacitor Cst. However, embodiments of the disclosure are not necessarily limited thereto. In some embodiments, the storage capacitor Cst does not overlap the first thin-film transistor T1 and is spaced apart from the first thin-film transistor T1.

A second storage electrode CE2 of the storage capacitor Cst overlaps the first storage electrode CE1 with the second gate insulating layer 113 located therebetween. The second gate insulating layer 113 functions as a dielectric layer of the storage capacitor Cst. The second storage electrode CE2 includes a conductive material that includes at least one of molybdenum (Mo), aluminum (Al), copper (Cu), or titanium (Ti), and may have a single or multi-layer structure that include the above materials. For example, the second storage electrode CE2 may have a single-layer structure that includes Mo, or a multi-layer structure that includes Mo/Al/Mo.

An interlayer insulating layer 115 is formed over the entire surface of the substrate 100 and covers the second storage electrode CE2. The interlayer insulating layer 115 includes at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The first source electrode S1, the second source electrode S2, the first drain electrode D1, and the second drain electrode D2 are disposed on the interlayer insulating layer 115. Each of the first source electrode S1, the second source electrode S2, the first drain electrode D1, and the second drain electrode D2 extends through the interlayer insulating layer 115, the second gate insulating layer 113 and the first gate insulating layer 112 and makes contact with the first semiconductor layer A1 or the second semiconductor layer A2, respectively. Each of the first source electrode S1, the second source electrode S2, the first drain electrode D1, and the second drain electrode D2 includes a conductive material that includes at least one of molybdenum (Mo), aluminum (Al), copper (Cu), or titanium (Ti), and may have a single or multi-layer structure that include the above materials. For example, each of the first source electrode S1, the second source electrode S2, the first drain electrode D1, and the second drain electrode D2 has a multi-layer structure that includes Ti/Al/Ti.

A planarization layer 118 is disposed on the interlayer insulating layer 115 and covers first source electrode S1, the second source electrode S2, the first drain electrode D1, and the second drain electrode D2, and the display element 210 is disposed on the planarization layer 118. The display element 210 includes a pixel electrode 211, an emission layer 213, and a counter electrode 215.

The planarization layer 118 has a flat top surface that planarizes the pixel electrode 211. The planarization layer 118 may have a single or multi-layer structure that includes an organic material or an inorganic material. For example, the planarization layer 118 includes at least one of benzo-cyclobutene (BCB), polyimide, hexamethyldisiloxane (HMDSO), a general-purpose polymer such as polymethyl methacrylate (PMMA) or polystyrene (PS), a polymer derivative that includes a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof. The planarization layer 118 may also include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). After the planarization layer 118 is formed, chemical mechanical polishing is performed to provide a flat top surface.

An opening that exposes one of the first source electrode S1 and the first drain electrode D1 of the first thin-film transistor T1 is formed in the planarization layer 118, and the pixel electrode 211 contacts the first source electrode S1 or the first drain electrode D1 through the opening and is electrically connected to the first thin-film transistor T1.

The pixel electrode 211 includes a conductive oxide such as at least one of indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 211 includes a reflective film that includes at least one of silver (Ag), magnesium (Mg), aluminum (Al), platinum (Pt), palladium (Pd), gold (Au), nickel (Ni), neodymium (Nd), iridium (Ir), chromium (Cr), or a compound thereof. In an embodiment, the pixel electrode 210 further includes a film formed of at least one of ITO, IZO, ZnO, or $In_2O_3$ over/under the above reflective film. For example, the pixel electrode 211 has a multi-layer structure that includes ITO/Ag/ITO.

A pixel-defining film 119 is disposed on the pixel electrode 211 and the planarization layer 118. The pixel-defining film 119 defines a pixel by having an opening 1190P that corresponds to each pixel, such as an opening through which at least a central portion of the pixel electrode 211 is exposed. In addition, the pixel-defining film 119 increases a distance between an edge of the pixel electrode 211 and a counter electrode 215, thereby preventing an arc, etc., from occurring between the edge of the pixel electrode 211 and the counter electrode 215. The pixel-defining film 119 is formed of an organic material such as one of PI or HMDSO.

A spacer may be disposed on the pixel-defining film 119. The spacer prevents damage to a mask that may occur in a mask process. The spacer is formed of an organic material such as PI or HMDSO. The spacer and the pixel-defining film 119 are simultaneously formed by using the same material. For example, a halftone mask can be used.

The emission layer 213 of the display element 210 includes an organic material that includes a fluorescent or phosphorescent material that emits red, green, blue, or white light. The emission layer 213 is formed of an organic material, and functional layers such as a hole transport layer (HTL), a hole injection layer (HIL), an electron transport layer (ETL), and an electron injection layer (EIL) are selectively located under and over the emission layer. The emission layer 213 corresponds to each of a plurality of pixel electrodes 211. However, embodiments of the disclosure are not necessarily limited thereto, and various modifications are made in other embodiments. For example, the emission layer 213 includes an integrated layer that covers all of the plurality of pixel electrodes 211.

The counter electrode 215 may be a light-transmitting electrode or a reflective electrode. Alternatively, the counter electrode 215 may be a transparent or semi-transparent electrode, and includes a metallic thin film that has a low work function and that includes at least one of ytterbium (Yb), lithium (Li), calcium (Ca), LiF/Ca, LiF/Al, aluminum (Al), silver (Ag), magnesium (Mg), or a compound thereof. In addition, a transparent conductive oxide (TCO) film such as at least one of ITO, IZO, ZnO, or $In_2O_3$ may be further disposed on the metallic thin film. The counter electrode 215 is disposed over the entire display area DA and the peripheral area PA, and is disposed on the emission layer 213 and the pixel-defining film 119. The counter electrode 215 is integrally formed for the plurality of display elements 210 and corresponds to each of the plurality of pixel electrodes 211.

The capping layer 220 is disposed on the display element 210. For example, the capping layer 220 is disposed on the counter electrode 215. The capping layer 220 may include an organic material and/or an inorganic material. When the capping layer 220 includes an organic material, the capping layer 220 includes at least one of α-NPD, NPB, TPD, m-MTDATA, $Alq_3$, CuPc, N4,N4,N4',N4'-tetra (biphenyl-4-yl) biphenyl-4,4'-diamine (TPD15), or 4,4',4''-Tris (carbazol sol-9-yl) triphenylamine (TCTA), or may include an epoxy resin or an acrylate such as methacrylate. Alternatively, when the capping layer 220 includes an inorganic material, the capping layer 220 includes an alkali metal compound such as at least one of LiF, an alkaline earth metal compound such as $MgF_2$, silicon oxide ($SiO_2$), silicon nitride ($SiN_x$), or silicon oxynitride (SiON). The capping layer 220 may have a single or multi-layer structure. Because the capping layer

220 is provided on the display element 210, the efficiency of light emitted from the display element 210 is increased.

The thin-film encapsulation layer 300 is disposed on the capping layer 220. The thin-film encapsulation layer 300 includes at least one inorganic encapsulation layer and at least one organic encapsulation layer. For example, the thin-film encapsulation layer 300 includes a first inorganic encapsulation layer 310, an organic encapsulation layer 320, and a second inorganic encapsulation layer 330 that are sequentially stacked.

The first inorganic encapsulation layer 310 includes at least one inorganic material. For example, the first inorganic encapsulation layer 310 includes at least one of a ceramic, a metal oxide, a metal nitride, a metal carbide, a metal oxynitride, indium oxide ($In_2O_3$), tin oxide ($SnO_2$), ITO, silicon oxide, silicon nitride, and/or silicon oxynitride. The first inorganic encapsulation layer 310 may have a single or multi-layer structure.

The organic encapsulation layer 320 includes at least one of acryl, methacrylic, polyester, polyethylene, polypropylene, PET, PEN, PC, PI, polyethylene sulfonate, polyoxymethylene, polyaylate, or HMDSO.

The second inorganic encapsulation layer 330 covers the organic encapsulation layer 320, and includes at least one of a ceramic, a metal oxide, a metal nitride, a metal carbide, a metal oxynitride, indium oxide ($In_2O_3$), tin oxide ($SnO_2$), ITO, silicon oxide, silicon nitride, and/or silicon oxynitride. The second inorganic encapsulation layer 330 may have a single or multi-layer structure. The second inorganic encapsulation layer 330 contacts the first inorganic encapsulation layer 310 at an edge located outside the display area DA and prevents the organic encapsulation layer 320 from being externally exposed.

As such, since the thin-film encapsulation layer 300 includes the first inorganic encapsulation layer 310, the organic encapsulation layer 320, and the second inorganic encapsulation layer 330, even when cracks occur in the thin-film encapsulation layer 300, due to the multi-layer structure, the cracks do not connect the first inorganic encapsulation layer 310 and the organic encapsulation layer 320 or the organic encapsulation layer 320 and the second inorganic encapsulation layer 330. Accordingly, the formation of a path through which external moisture or oxygen can penetrate into the display layer 200 is prevented or minimized.

Figure 4:
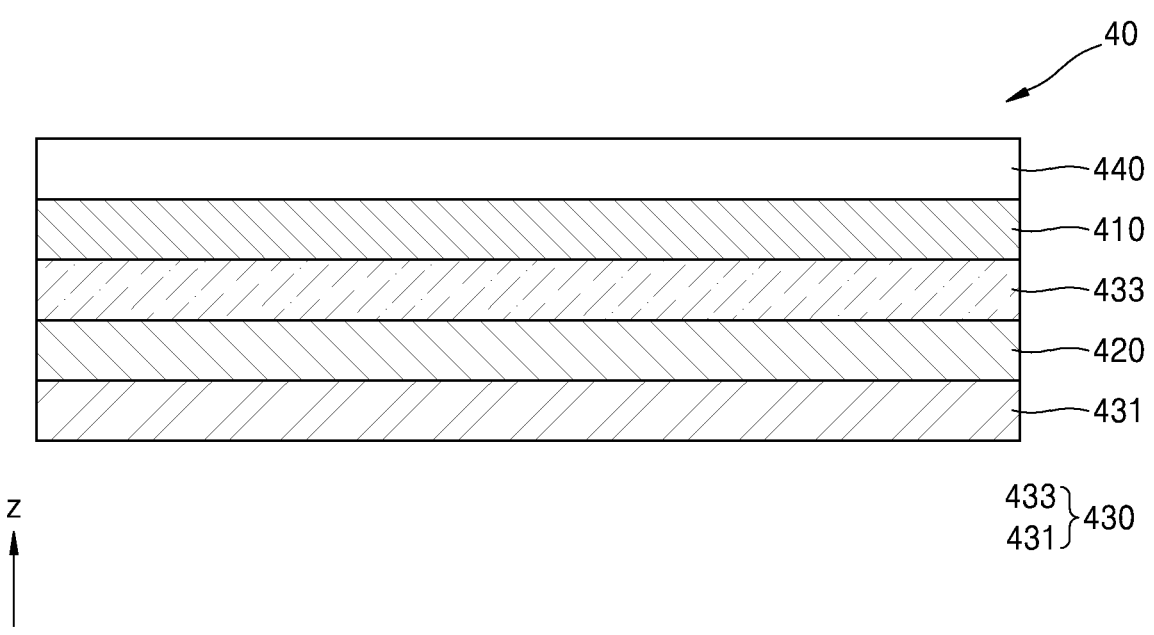
FIG. 4 is a cross-sectional view of a part of a polarization film of a display apparatus, according to an embodiment.

FIG. 4 is a cross-sectional view of a part of a polarization film of a display apparatus, according to an embodiment.

Referring to FIG. 4, in an embodiment, the display apparatus 1 (see FIG. 2) includes the display panel 10 (see FIG. 2) and the polarization film 40, and the polarization film 40 includes a polarization layer 410, a phase retardation layer 420, a phase compensation layer 430, and a protective substrate 440.

The polarization layer 410 polarizes light received from a light source into light of the same direction as a polarization axis. The polarization layer 410 includes a polarizer and/or a dichroic dye in a polyvinyl alcohol (PVA) film. The dichroic dye includes iodine molecules and/or dye molecules. Alternatively, the polarization layer 410 is formed by stretching a PVA film in one direction and immersing the PVA film in a solution of iodine and/or dichroic dye. For example, the iodine molecules and/or dichroic dye molecules are arranged in a direction parallel to a stretching direction. Since the iodine molecules and the dye molecules exhibit dichroism, the iodine molecules and the dye molecules absorb light that oscillates in the stretching direction and transmits light that oscillates in a direction perpendicular to the stretching direction.

The phase retardation layer 420 is disposed under the polarization layer 410. The phase retardation layer 420 delays a phase of light polarized through the polarization layer 410. Light passing through the phase retardation layer 420 is converted into circularly polarized light or elliptically polarized light. Accordingly, light reflectance is reduced. The phase retardation layer 420 is located farther from a light source than the polarization layer 410. For example, when external light is incident on the polarization layer 410, the phase retardation layer 420 is located under the polarization layer 410.

The phase retardation layer 420 includes a positive A plate. For example, the phase retardation layer 420 is a positive A plate. However, embodiments of the disclosure are not necessarily limited thereto. In other embodiments, the phase retardation layer 420 is one of a negative A plate, a positive C plate, or a negative C plate. The phase retardation layer 420 includes a quarter-wave plate (QWP). For example, the phase retardation layer 420 is a QWP. The phase retardation layer 420 is formed of at least one of PC, tri-acetyl cellulose (TAC), or a cyclo-olefin polymer.

The phase compensation layer 430 includes a first phase compensation layer 431 and a second phase compensation layer 433. The first phase compensation layer 431 includes a positive C plate. For example, the first phase compensation layer 431 is a positive C plate. However, embodiments of the disclosure are not necessarily limited thereto. In other embodiments, the first phase compensation layer 431 is one of a positive A plate, a negative A plate, or a negative C plate. The first phase compensation layer 431 is formed of at least one of PC, TAC, or a cyclo-olefin polymer.

The second phase compensation layer 433 includes a TAC film. For example, the second phase compensation layer 433 is a TAC film. The second phase compensation layer 433 includes at least one of PC or a cyclo-olefin polymer. Alternatively, in other embodiments, the second phase compensation layer 433 includes one of a positive C plate, a positive A plate, a negative A plate, or a negative C plate. The second phase compensation layer 433 supports the polarization layer 410 and compensates for the mechanical strength of the polarization layer 410.

The protective substrate 440 is disposed on the polarization layer 410. The protective substrate 440 protects the polarization layer 410 and compensates for the mechanical strength of the polarization layer 410. The protective substrate 440 includes at least one of TAC, cyclo-olefin polymer, polymethyl methacrylate (PMMA), or polyethylene terephthalate (PET).

In an embodiment, the second phase compensation layer 433 is disposed on the first phase compensation layer 431, and the phase retardation layer 420 is located between the first phase compensation layer 431 and the second phase compensation layer 433. In addition, the polarization layer 410 is located on the second phase compensation layer 433, and the protective substrate 440 may be located on the polarization layer 410.

Figure 5:
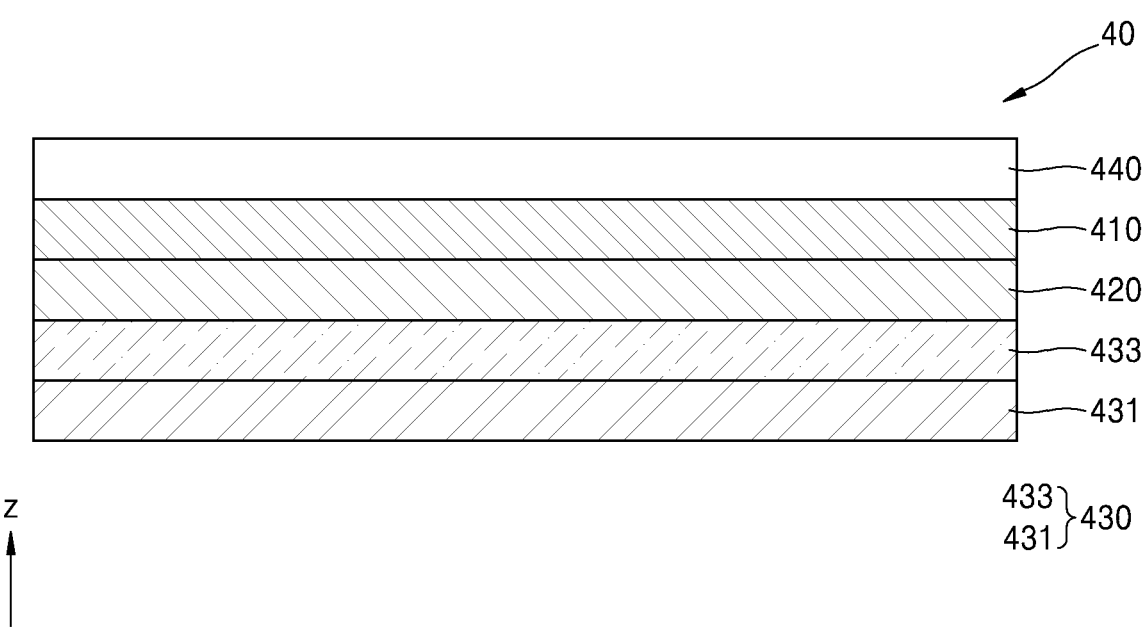
FIG. 5 is a cross-sectional view of a part of a polarization film of a display apparatus, according to an embodiment.

FIG. 5 is a cross-sectional view of a part of a polarization film of a display apparatus, according to an embodiment. An embodiment of FIG. 5 differs from an embodiment of FIG. 4 in that the second phase compensation layer 433 is located under the phase retardation layer 420. In FIG. 5, the same members are denoted by the same reference numerals, and thus a repeated description thereof will be omitted.

Referring to FIG. 5, in an embodiment, the second phase compensation layer 433 is disposed on the first phase compensation layer 431, and the phase retardation layer 420 is disposed on the second phase compensation layer 433. In addition, the polarization layer 410 is disposed on the phase retardation layer 420, and the protective substrate 440 is disposed on the polarization layer 410. For example, the phase retardation layer 420 is located between the second phase compensation layer 433 and the polarization layer 410.

In an embodiment, the second phase compensation layer 433 includes a negative C plate.

For example, the second phase compensation layer 433 is a negative C plate. When the second phase compensation layer 433 is a negative C plate, the second phase compensation layer 433 is located on a side of the phase retardation layer 420. For example, when the second phase compensation layer 433 is a negative C plate, the second phase compensation layer 433 is located between the phase retardation layer 420 and the polarization layer 410, or is located between the first phase compensation layer 431 and the phase retardation layer 420.

Figure 6:
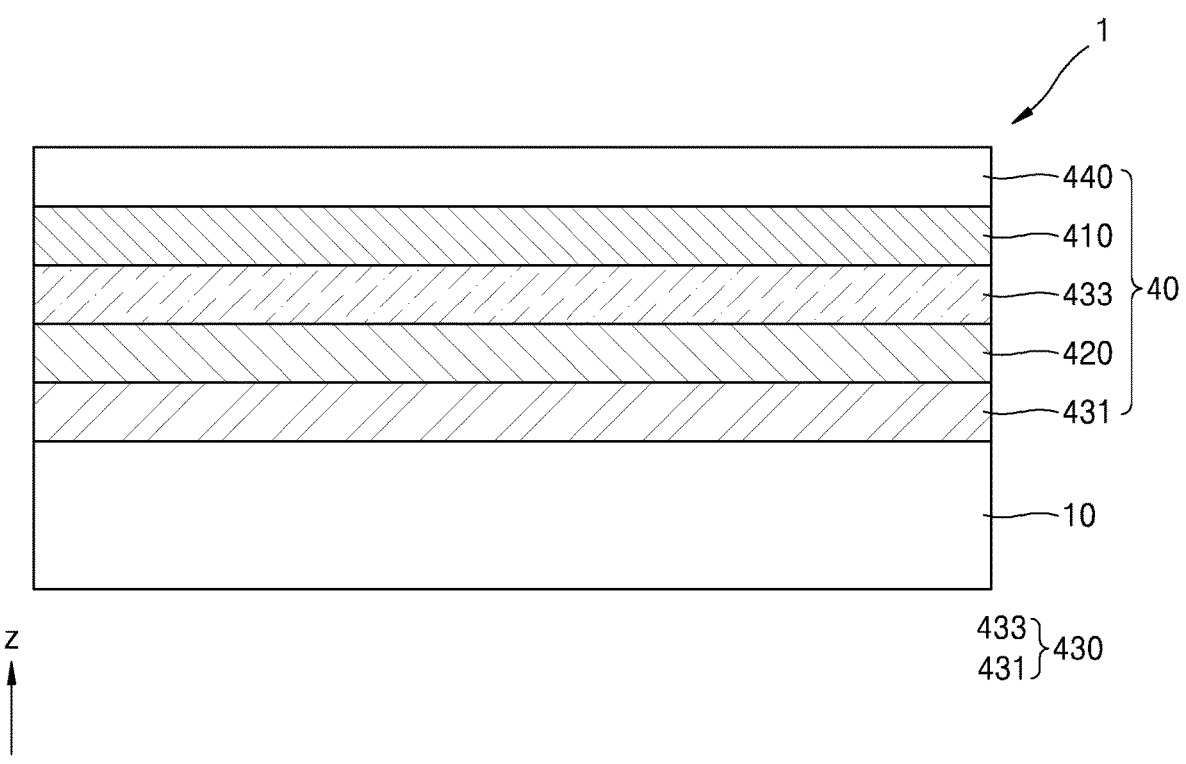
FIGS. 6 and 7 are cross-sectional views of a display apparatus, according to an embodiment.
Figure 7:
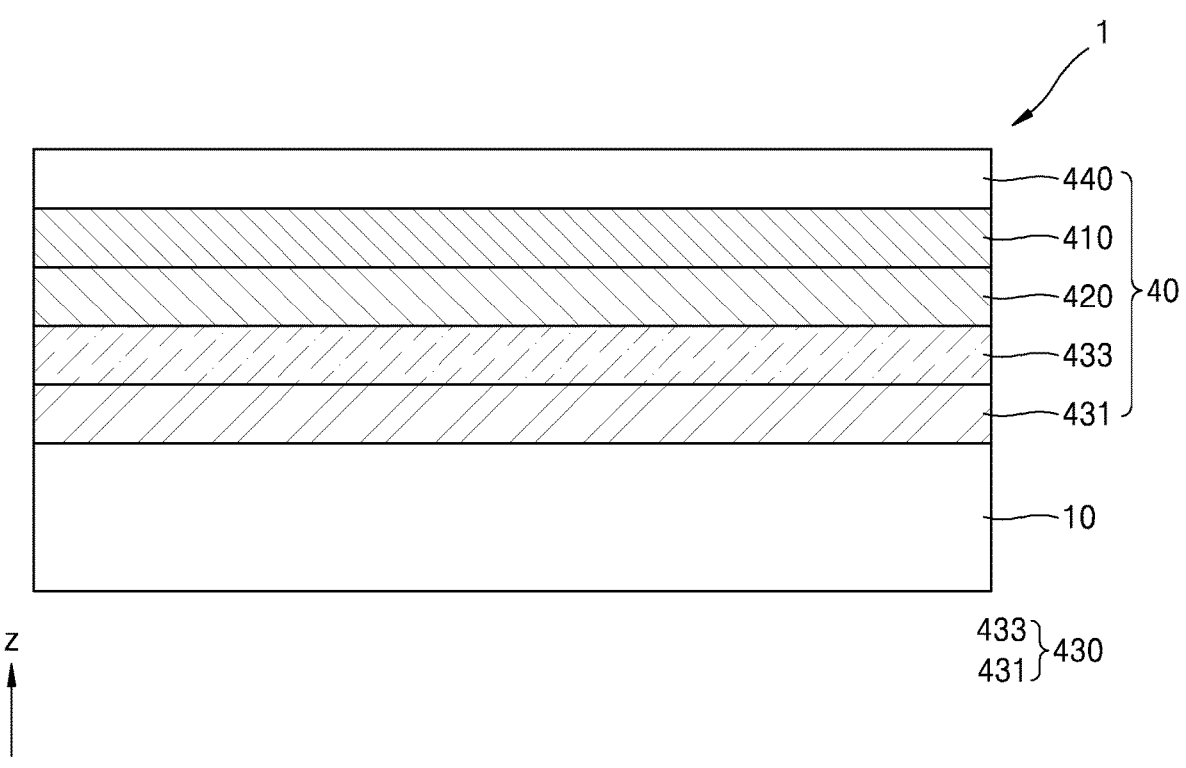

FIGS. 6 and 7 are cross-sectional views of a display apparatus, according to an embodiment. The display panel 10 of FIGS. 6 and 7 corresponds to the display panel 10 of FIG. 3, and the polarization films 40 of FIGS. 6 and 7 respectively correspond to the polarization films 40 of FIGS. 4 and 5. The input sensing layer 30 (see FIG. 2) is disposed between the display panel 10 and the polarization layer 40, as described with reference to FIG. 2.

Referring to FIGS. 6 and 7, the display apparatus 1 according to an embodiment includes the display panel 10 and the polarization film 40. The display panel 10 includes the display element 210 (see FIG. 3) and the thin-film encapsulation layer 300 (see FIG. 3) disposed on the display element 210 (see FIG. 3). In addition, the polarization film 40 includes the polarization layer 410, the phase retardation layer 420, and the phase compensation layer 430.

The thin-film encapsulation layer 300 of the display panel 10 includes the first inorganic encapsulation layer 310 (see FIG. 3), the organic encapsulation layer 320 (see FIG. 3), and the second inorganic encapsulation layer 330 (see FIG. 3), and each of the first inorganic encapsulation layer 310 and the second inorganic encapsulation layer 330 includes at least one inorganic material.

The first inorganic encapsulation layer 310 and the second inorganic encapsulation layer 330 include a plurality of layers that have different refractive indices. For example, the thin-film encapsulation layer 300 of the display panel 10 includes multiple layers that have a large refractive index difference.

The display apparatus 1 should display black on a screen when power is turned off. For example, when a pixel structure of the display apparatus 1 is visible to a user as is, the aesthetics of a product decrease. Accordingly, the screen should appear black in a power-off state of the display apparatus 1.

For example, a thickness direction phase difference Rth of the display apparatus 1 satisfies Equation 1.

$$-1.5 \text{ nm} \leq Rth \leq +1.5 \text{ nm} \qquad \text{Equation 1}$$

When the thickness direction phase difference Rth of the display apparatus 1 is greater than $\pm 1.5$ nm, for example, when the thickness direction phase difference Rth of the display apparatus 1 does not satisfy Equation 1, a reflectance increases in a power-off state, a reflection color of black shifts to a specific color, such as green, which hinders a seamless design.

Accordingly, when the thickness direction phase difference Rth of the display apparatus 1 is within ±1.5 nm, a reflection color of the display apparatus 1 is prevented from shifting to a specific color, such as green, and a reflection color change for each azimuth is minimized in a power-off state of the display apparatus 1.

However, when the display panel 10 includes the thin-film encapsulation layer 300 that includes multiple layers that have a large refractive index difference, a thickness direction phase difference Rth1 of the display panel 10 changes. For example, when the display panel 10 includes the thin-film encapsulation layer 300 that includes multiple layers that have a large refractive index difference, the thickness direction phase difference Rth1 of the display panel decreases due to a change in a resonance structure. For example, as described below, because the thickness direction phase difference Rth1 of the display panel 10 has a negative value, when the thickness direction phase difference Rth1 of the display panel 10 decreases, an absolute value of the thickness direction phase difference Rth1 of the display panel 10 increases.

In an embodiment, when the display panel 10 includes the thin-film encapsulation layer 300 that includes multiple layers that have a large refractive index difference, the thickness direction phase difference Rth1 of the display panel 10 with respect to a wavelength of 550 nm is about −35 nm or less. For example, the thickness direction phase difference Rth1 of the display panel 10 can be expressed as in Equation 2.

$$Rth1 \leq -35 \text{ nm} \qquad \text{Equation 2}$$

Alternatively, in an embodiment, when the display panel 10 includes the thin-film encapsulation layer 300 that includes multiple layers that have a large refractive index difference, the thickness direction phase difference Rth1 of the display panel with respect to a wavelength of 550 nm is about −25 nm or less.

A thickness direction phase difference Rth2 of the phase retardation layer 420 of the polarization film 40 is about +71 nm. For example, the thickness direction phase difference Rth2 of the phase retardation layer 420 of the polarization film 40 with respect to a wavelength of 550 nm is about +71 nm.

A thickness direction phase difference Rth3 of the first phase compensation layer 431 of the polarization film 40 can be derived by Equation 3.

$$Rth3 = ((nx+ny)/2 - nz) \times d \qquad \text{Equation 3}$$

In Equation 3, nx denotes a refractive index of the first phase compensation layer 431 in an x-direction, ny denotes a refractive index of the first phase compensation layer 431 in a y-direction, nz is a refractive index of the first phase compensation layer 431 in a z-direction, and d is a thickness (nm) of the first phase compensation layer 431.

When the first phase compensation layer 431 of the polarization film 40 includes a positive C plate, because nz>nx=ny, the thickness direction phase difference Rth3 of the first phase compensation layer 431 has a negative value.

As a thickness of the first phase compensation layer 431 decreases, the thickness direction phase difference Rth3 of the first phase compensation layer 431 increases. For example, because the thickness direction phase difference Rth3 of the first phase compensation layer 431 has a negative value, when the thickness direction phase difference Rth3 of the first phase compensation layer 431 increases, an absolute value of the thickness direction phase difference Rth3 of the first phase compensation layer 431 decreases.

As described above, when the display panel 10 includes the thin-film encapsulation layer 300 that includes multiple layers that have a large refractive index difference, because the thickness direction phase difference Rth1 of the display panel 10 decreases, the thickness direction phase difference Rth of the display apparatus 1 can satisfy Equation 1 by increasing the thickness direction phase difference Rth3 of the first phase compensation layer 431.

For example, the thickness direction phase difference Rth3 of the first phase compensation layer 431 can be increased by reducing a thickness of the first phase compensation layer 431. However, the thickness direction phase difference Rth3 of the first phase compensation layer 431 is about −40 nm due to the minimum coating thickness restriction of a process of manufacturing the first phase compensation layer 431. For example, when the first phase compensation layer 431 includes a positive C plate, the first phase compensation layer 431 is formed by, in the following order, coating the alignment layer, orienting the alignment layer, coating the liquid crystal, and performing UV curing. A thickness of the first phase compensation layer 431 is not reduced to the extent that the thickness direction phase difference Rth3 of the first phase compensation layer 431 exceeds about −40 nm due to the minimum coating thickness restriction of a coating process. The thickness direction phase difference Rth3 of the first phase compensation layer 431 with respect to a wavelength of 550 nm is about −40 nm. For example, the thickness direction phase difference Rth3 of the first phase compensation layer 431 can be expressed as in Equation 4.

$$Rth3 \leq -40 \text{ nm} \qquad \text{Equation 4}$$

Accordingly, for the thickness direction phase difference Rth of the display apparatus 1 to satisfy Equation 1, a compensation layer having a positive thickness direction phase difference is further required.

In an embodiment, the polarization film 40 includes the second phase compensation layer 433, and the second phase compensation layer 433 has a positive thickness direction phase difference. The second phase compensation layer 433 includes one of a TAC film or a negative C plate. For example, when the second phase compensation layer 433 includes a TAC film, as shown in FIG. 6, the second phase compensation layer 433 is located between the phase retardation layer 420 and the polarization layer 410. In contrast, when the second phase compensation layer 433 includes a negative C plate, as shown in FIGS. 6 and 7, the second phase compensation layer 433 may be located between the phase retardation layer 420 and the polarization layer 410, or may be located between the first phase compensation layer 431 and the phase retardation layer 420.

A thickness direction phase difference Rth4 of the second phase compensation layer 433 is about +4 nm or more. For example, the thickness direction phase difference Rth4 of the second phase compensation layer 433 with respect to a wavelength of 550 nm is about +4 nm or more. For example, the thickness direction phase difference Rth4 of the second phase compensation layer 433 can be expressed as in Equation 5.

$$Rth4 \geq +4 \text{ nm} \qquad \text{Equation 5}$$

In an embodiment, since the polarization film 40 includes the second phase compensation layer 433 that has the thickness direction phase difference Rth4 of +4 nm or more, the entire thickness direction phase difference Rth of the display apparatus 1 that includes the polarization film 40 has a value within ±1.5 nm, and thus, a reflection color of the display apparatus 1 does not shift to a specific color, such as green, and a reflection color change for each azimuth in a power-off state of the display apparatus 1 is minimized.

For example, the display apparatus 1 includes the display panel 10 and the polarization film 40. For example, the display panel 10 of the display apparatus 1 includes the thin-film encapsulation layer 300 that includes multiple layers that have a large refractive index difference, and the polarization film 40 of the display apparatus 1 includes the polarization layer 410, the phase retardation layer 420, the first phase compensation layer 431, and the second phase compensation layer 433. In addition, when the thickness direction phase difference Rth1 of the display panel 10 that includes the thin-film encapsulation layer 300 that includes multiple layers that have a large refractive index difference is less than or equal to about –35 nm, the thickness direction phase difference Rth2 of the phase retardation layer 420 is about +71 nm, the thickness direction phase difference Rth3 of the first phase compensation layer 431 is less than or equal to about –40 nm, and the thickness direction phase difference Rth4 of the second phase compensation layer 433 is greater than or equal to about +4 nm, because the entire thickness direction phase difference Rth of the display apparatus 1 has a value within ±4 nm. Thus, a reflection color of the display apparatus 1 is prevented from shifting to a specific color, such as green, and a reflection color change for each azimuth in a power-off state of the display apparatus 1 is minimized.

Figure 8A:
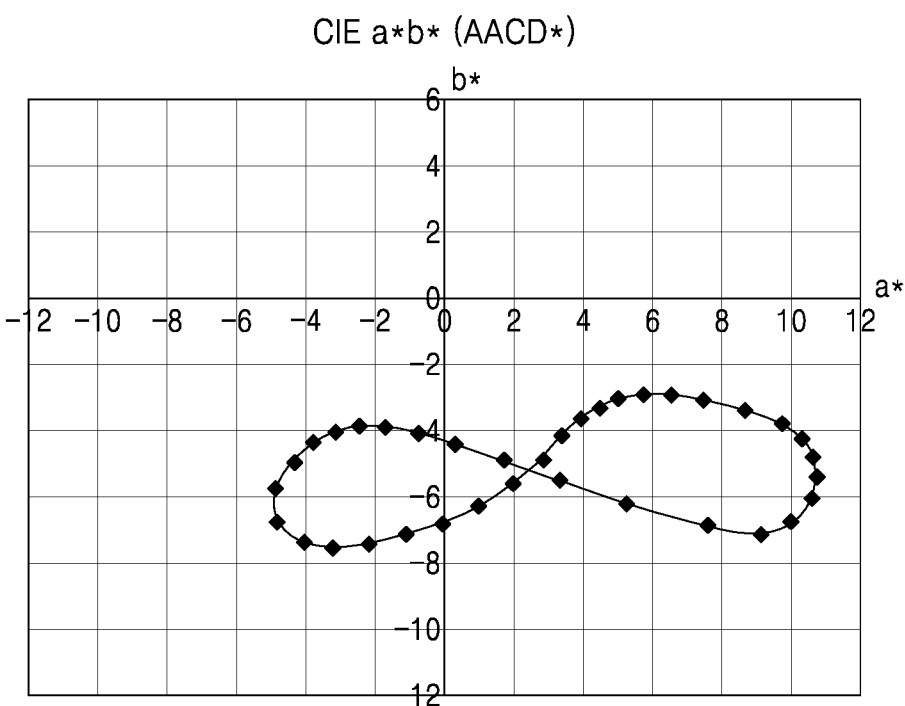
FIGS. 8A to 8D are graphs of reflection chroma as a function of a change in a viewing angle in a CIE L*a*b* coordinate system, when an entire thickness direction phase difference of a display apparatus is about −67 nm, about −47 nm, about −17 nm, and about 0 nm.
Figure 8B:
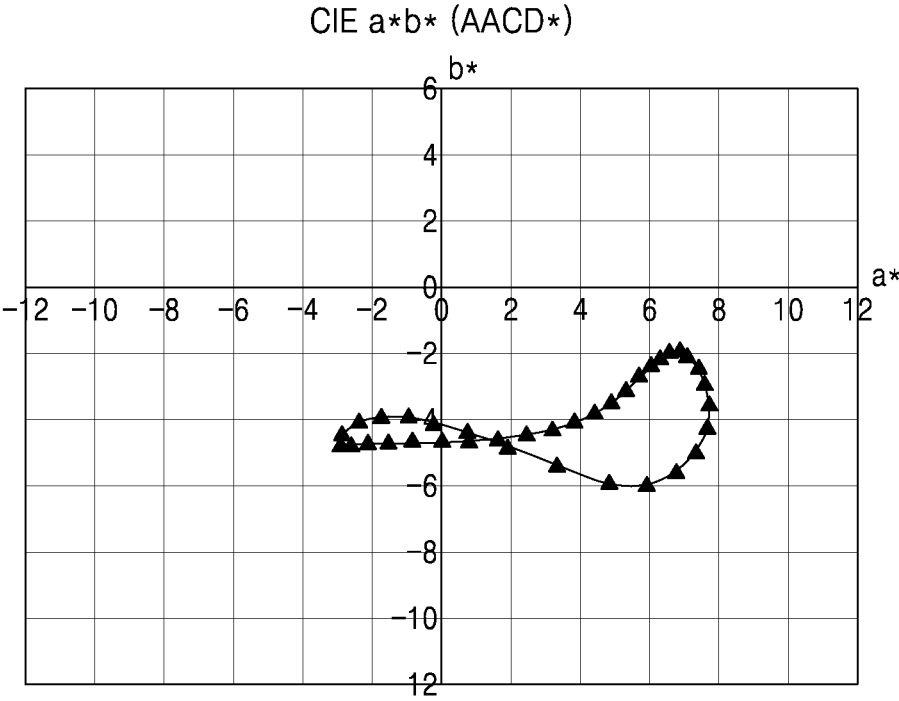
Figure 8C:
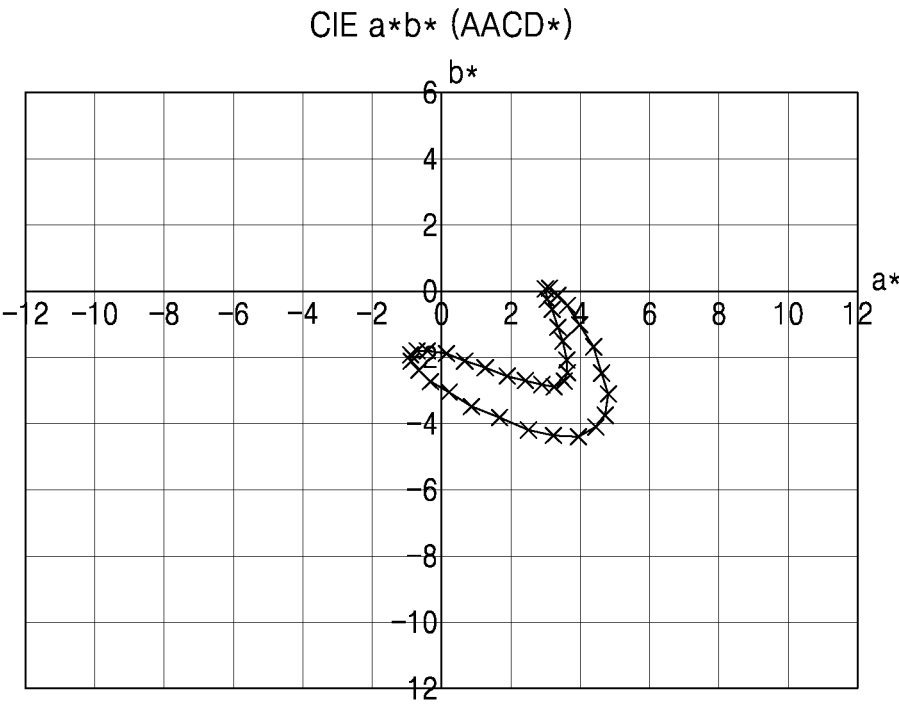
Figure 8D:
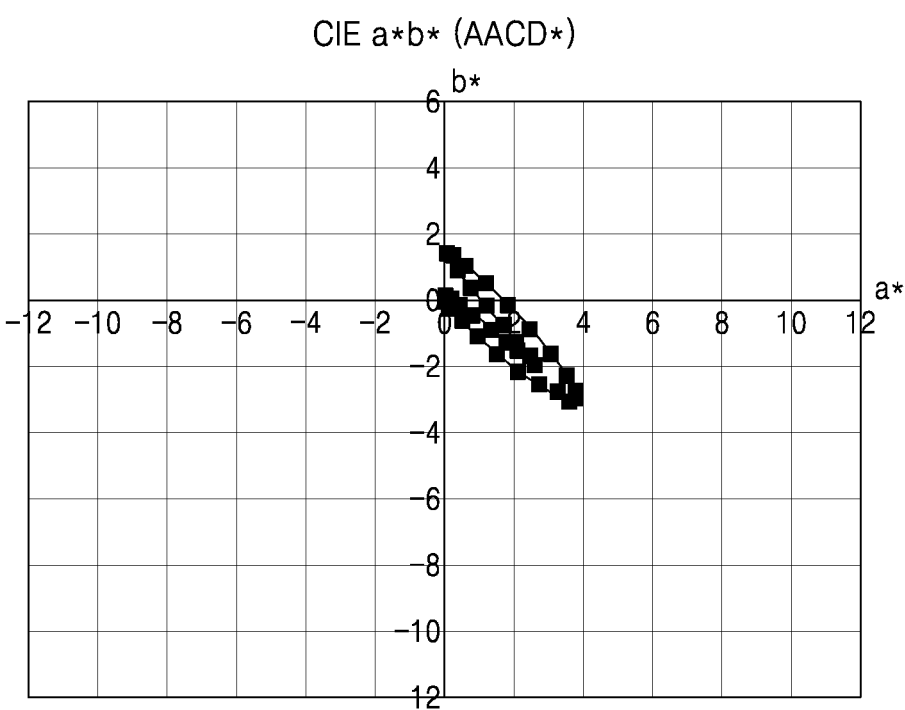

FIGS. 8A to 8D are graphs of reflection chroma as a function of a change in a viewing angle in a CIE L\*a\*b\* coordinate system, when an entire thickness direction phase difference of a display apparatus is about –67 nm, about –47 nm, about –17 nm, and about 0 nm. For example, FIG. 8A is a graph of reflection chroma in a CIE L\*a\*b\* coordinate system when an entire thickness direction phase difference Rth of a display apparatus is about –67 nm. FIG. 8B is a graph of reflection chroma in a CIE L\*a\*b\* coordinate system when the entire thickness direction phase difference Rth of the display apparatus is about –47 nm. FIG. 8C is a graph of reflection chroma in a CIE L\*a\*b\* coordinate system when the entire thickness direction phase difference Rth of the display apparatus is about –17 nm. FIG. 8D is a graph of reflection chroma in a CIE L\*a\*b\* coordinate system when the entire thickness direction phase difference Rth of the display apparatus is about 0 nm. In addition, a\* and b\* of FIGS. 8A to 8D denote values measured for an azimuth angle of φ=0 to 360° at a polar angle of 60°.

In FIGS. 8A to 8D, when a\*=0 and b\*=0 in CIE L\*a\*b\* color space coordinates, a reflection chroma refers to neutral black.

In the CIE L\*a\*b\* coordinate system, as a distance from a\*=0 and b\*=0 increases, for example, +a\* indicates a red direction, –a\* indicates a green direction, +b\* indicates a yellow direction, and –b\* indicates a blue direction. For example, in the CIE L\*a\*b\* coordinate system, as a distance from a\*=0 and b\*=0 increases, a first quadrant indicates a red-based color, a second quadrant indicates a green-based color, a third quadrant indicates a blue-based color, and a fourth quadrant indicates a purple-based color. Alternatively, when a\* is a negative value, it represents a color closer to green; when a\* is a positive value, it represents a color closer to red or purple; when b\* is a negative value, it represents blue; and when b\* is a positive value, it represents a color closer to yellow.

When a distance from coordinates a\*=0 and b\*=0 increases, a reflected light chroma increases. In addition, when a reflected light chroma increases, a color is visibly recognized and black visibility decreases.

Referring to FIGS. 8A to 8D, when the entire thickness direction phase difference Rth of the display apparatus 1 decreases, a distance from a\*=0 and b\*=0 increases. For example, because the entire thickness direction phase difference Rth of the display apparatus 1 has a negative value, when an absolute value of the entire thickness direction phase difference Rth of the display apparatus 1 increases, a distance from a\*=0 and b\*=0 increases.

For example, when the entire thickness direction phase difference Rth of the display apparatus 1 is about –67 nm, a\* and b\* values are respectively farther from a\*=0 and b\*=0 than when the entire thickness direction phase difference Rth of the display apparatus 1 is about –47 nm. When the entire thickness direction phase difference Rth of the display apparatus 1 is about –47 nm, a\* and b\* values are respectively farther from a\*=0 and b\*=0 than when the entire thickness direction phase difference Rth of the display apparatus 1 is about –17 nm. When the entire thickness direction phase difference Rth of the display apparatus 1 is about –17 nm, a\* and b\* values are respectively farther from a\*=0 and b\*=0 than when the entire thickness direction phase difference Rth of the display apparatus 1 is about 0 nm. In addition, when the entire thickness direction phase difference Rth of the display apparatus 1 is about 0 nm, a\* and b\* values are closer to 0 than in other cases.

Accordingly, as the entire thickness direction phase difference Rth of the display apparatus 1 increases, black visibility in a power-off state of the display apparatus 1 increases. For example, as the entire thickness direction phase difference Rth of the display apparatus 1 approaches 0, black visibility in a power-off state of the display apparatus 1 increases.

In addition, side characteristics azimuthal angle color distribution (AACD) can be obtained by using the following equation:

$$\text{AACD(Azimuthal Angle Color Distribution)} = \{\text{Max}(a^*) - \text{Min}(a^*)\} \times \{\text{Max}(b^*) - \text{Min}(b^*)\}$$

Here, a\* and b\* are coordinate values in a CIE L\*a\*b\* coordinate system, Max(a\*) and Min(a\*) are respectively a maximum value and a minimum value of a\* coordinate values measured for an azimuth angle of φ=0 to 360°, and Max(b\*) and Min(b\*) are respectively a maximum value and a minimum value of b\* coordinate values measured for an azimuth angle of φ=0 to 360° at a polar angle of 60°.

The side characteristics are extracted from values in the CIE L\*a\*b\* coordinate system according to the azimuth angle, and as a value decreases, a side color change according to the azimuth angle decreases.

Referring to FIGS. 8A to 8D, when the entire thickness direction phase difference Rth of the display apparatus 1 is about –67 nm, an ACCD value is about 71.63. When the entire thickness direction phase difference Rth of the display apparatus 1 is about –47 nm, an AACD value is about 43.26. When the entire thickness direction phase difference Rth of the display apparatus 1 is about –17 nm, an AACD value is about 25.49, and when the entire thickness direction phase difference Rth of the display apparatus 1 is about 0 nm, an AACD value is about 16.

Accordingly, as the entire thickness direction phase difference Rth of the display apparatus 1 increases, an AACD value decreases. For example, as the entire thickness direction phase difference Rth of the display apparatus 1 approaches 0, an AACD value decreases. As an AACD value decreases, a side color change decreases according to an azimuth angle. Accordingly, as the entire thickness direction phase difference Rth of the display apparatus 1 approaches 0, a reflection color change decreases according to an azimuth angle.

As described above, the display apparatus 1 includes the display panel 10 and the polarization film 40. For example, the display panel 10 of the display apparatus 1 includes the thin-film encapsulation layer 300 that includes multiple layers that have a large refractive index difference, and the polarization film 40 of the display apparatus 1 includes the polarization layer 410, the phase retardation layer 420, the first phase compensation layer 431, and the second phase compensation layer 433. When the thickness direction phase difference Rth1 of the display panel 10 that includes the thin-film encapsulation layer 300 that includes multiple layers that have a large refractive index difference is less than or equal to about −35 nm, the thickness direction phase difference Rth2 of the phase retardation layer 420 is about +71 nm, the thickness direction phase difference Rth3 of the first phase compensation layer 431 is less than or equal to about −40 nm, and the thickness direction phase difference Rth4 of the second phase compensation layer 433 is greater than or equal to about +4 nm. Since the entire thickness direction phase difference Rth of the display apparatus 1 has a value within ±1.5 nm, black visibility in a power-off state of the display apparatus 1 increases and a reflection color change according to an azimuth angle is minimized.

In a polarization film and a display apparatus that includes the same according to the one or more embodiments, because a thickness direction phase difference of a display apparatus has a value within a preset range, a display apparatus is provided that has increased visibility. However, the scope of embodiments of the disclosure is not limited by the effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display apparatus, comprising:
   a display panel that includes a display element and a thin-film encapsulation layer disposed on the display element; and
   a polarization film disposed on the display panel and that includes a phase compensation layer, a phase retardation layer, and a polarization layer,
   wherein a thickness direction phase difference of the display panel is less than or equal to about −35 nm or less.

2. The display apparatus of claim 1, wherein the phase compensation layer comprises a first phase compensation layer and a second phase compensation layer.

3. The display apparatus of claim 2, wherein the phase retardation layer is located between the first phase compensation layer and the second phase compensation layer.

4. The display apparatus of claim 2, wherein the second phase compensation layer is located between the phase retardation layer and the polarization layer.

5. The display apparatus of claim 2, wherein the first phase compensation layer comprises a positive C plate.

6. The display apparatus of claim 2, wherein a thickness direction phase difference of the first phase compensation layer is less than or equal to about −40 nm.

7. The display apparatus of claim 2, wherein the second phase compensation layer comprises a tri-acetyl cellulose (TAC) film.

8. The display apparatus of claim 2, wherein a thickness direction phase difference of the second phase compensation layer is greater than or equal to about +4 nm.

9. The display apparatus of claim 2, wherein the second phase compensation layer comprises a negative C plate.

10. The display apparatus of claim 2, wherein the second phase compensation layer is located on the first phase compensation layer, and the phase retardation layer is located on the second phase compensation layer.

11. The display apparatus of claim 1, wherein the phase retardation layer comprises a quarter-wave plate (QWP).

12. The display apparatus of claim 1, wherein the polarization film further comprises a protective substrate disposed on the polarization layer.

13. The display apparatus of claim 1, wherein the display element comprises a pixel electrode, a counter electrode, and an emission layer located between the pixel electrode and the counter electrode.

14. The display apparatus of claim 1, wherein the thin-film encapsulation layer comprises at least one inorganic encapsulation layer and at least one organic encapsulation layer.

15. The display apparatus of claim 14, wherein the at least one inorganic encapsulation layer comprises a first inorganic encapsulation layer that includes at least one inorganic material and a second inorganic encapsulation layer that includes at least one inorganic material.

16. A polarization film, comprising:
   a first phase compensation layer that includes a positive C plate;
   a phase retardation layer disposed on the first phase compensation layer;
   a second phase compensation layer disposed on a side of the phase retardation layer and that has a thickness direction phase difference of greater than or equal to about +4 nm; and
   a polarization layer disposed on the second phase compensation layer.

17. The polarization film of claim 16, wherein a thickness direction phase difference of the first phase compensation layer is less than or equal to about −40 nm.

18. The polarization film of claim 16, wherein the second phase compensation layer comprises a tri-acetyl cellulose (TAC) film or a negative C plate.

19. The polarization film of claim 16, wherein the phase retardation layer comprises a quarter-wave plate (QWP).

20. The polarization film of claim 16, further comprising a protective substrate disposed on the polarization layer.

21. A display apparatus, comprising:
   a display panel that includes a display element and a thin-film encapsulation layer disposed on the display element; and
   a polarization film disposed on the display panel and that includes a first phase compensation layer, a second phase compensation layer, a phase retardation layer, and a polarization layer,
   wherein a thickness direction phase difference of the first phase compensation layer is less than or equal to about −40 nm, and wherein a thickness direction phase difference of the second phase compensation layer is greater than or equal to about +4 nm.

22. The display apparatus of claim 21, wherein a thickness direction phase difference of the display panel is less than or equal to about −35 nm.

* * * * *